United States Patent
Wang

(10) Patent No.: US 6,833,993 B2
(45) Date of Patent: Dec. 21, 2004

(54) MULTICHIP PACKAGE

(75) Inventor: Meng Jen Wang, Pingtung (TW)

(73) Assignee: Advanced Semiconductor Engineering, Inc. (TW)

(*) Notice: Subject to any disclaimer, the term of this patent is extended or adjusted under 35 U.S.C. 154(b) by 115 days.

(21) Appl. No.: 10/376,483

(22) Filed: Mar. 3, 2003

(65) Prior Publication Data

US 2003/0227751 A1 Dec. 11, 2003

(30) Foreign Application Priority Data

Jun. 10, 2002 (TW) ........................... 91112739 A

(51) Int. Cl.⁷ .................................................. H05K 7/20
(52) U.S. Cl. ................ 361/704; 361/682; 361/719; 257/706; 257/712; 165/80.3
(58) Field of Search ............................ 361/682, 704, 361/718–720, 760; 257/706, 707, 712, 737, 738, 675, 676, 686, 713, 717, 668, 720, 718, 734, 796; 29/830; 174/260–264, 266, 252, 255; 438/108, 109, 612, 613

(56) References Cited

U.S. PATENT DOCUMENTS

| | | | | |
|---|---|---|---|---|
| 5,477,082 A | * | 12/1995 | Buckley et al. | 257/679 |
| 5,909,056 A | * | 6/1999 | Mertol | 257/704 |
| 6,118,177 A | * | 9/2000 | Lischner et al. | 257/706 |
| 6,201,301 B1 | * | 3/2001 | Hoang | 257/712 |
| 6,376,917 B1 | * | 4/2002 | Takeshita et al. | 257/778 |
| 6,462,421 B1 | * | 10/2002 | Hsu et al. | 257/777 |
| 6,472,762 B1 | * | 10/2002 | Kutlu | 257/778 |
| 6,507,115 B1 | * | 1/2003 | Hofstee et al. | 257/777 |
| 6,545,351 B1 | * | 4/2003 | Jamieson et al. | 257/712 |
| 6,765,152 B2 | * | 7/2004 | Giri et al. | 174/260 |
| 2004/0150098 A1 | * | 8/2004 | Lee | 257/706 |

* cited by examiner

Primary Examiner—Michael Datskovsky

(57) ABSTRACT

A multichip package mainly includes a substrate, a first chip disposed on the lower surface of the substrate by flip-chip bonding, at least one second chip and a heat spreader disposed on the upper surface of the substrate. A plurality of solder balls are formed at the periphery of the first chip on the lower surface of the substrate wherein the solder balls electrically connected to the first chip or the second chip.

29 Claims, 3 Drawing Sheets

MULTICHIP PACKAGE

BACKGROUND OF THE INVENTION

1. Field of the Invention

This invention generally relates to a chip package, and more particularly to a multichip package.

2. Description of the Related Art

As electronic devices have become more smaller and thinner, the packages for protecting IC chips and interconnecting the IC chips to exterior circuit have the same trend, too.

With ever increasing demands for miniaturization and higher operating speeds, multichip packages are increasingly attractive in a variety of electronics. Multichip packages that contain more than one chip can help minimize the system operational speed restrictions by combining two or more chips, for example, the processor, memory, and associated logic, into a single package. In addition, multichip packages decrease the interconnection length between IC chips thereby reducing signal delays and access times.

The most common multichip packages are the side-by-side multichip packages and stacked multichip packages. In the side-by-side multichip package, two or more IC chips are mounted next to each other (or side by side each other) on the principal mounting surface of a common substrate. Interconnections among the chips and conductive traces on the substrate are commonly made via wire bonding. In the stacked multichip package, two or more IC chips are stacked on each other in order on a substrate and respectively wire bonded to the substrate.

However, when the multichip package comprises an IC chip with high density and high frequency digital circuitry, the layout of the corresponding conductive traces on the substrate and I/O pads must be widened. If the side-by side multichip package is used in such case, the distance between the IC chip and the other chips will be significantly increased such that the package efficiency will be reduced. In another aspect, each IC chip, especially IC chips with high density and high frequency digital circuitry, will generate heat during operation. If the IC chips are stacked, the heat generated by the middle or the bottom layer IC chips can hardly be dissipated; therefore, the IC chip will be easily damaged, which adversely affects the quality of product.

Therefore, a multichip package is needed to overcome or at least solve the aforementioned problems of the prior arts.

SUMMARY OF THE INVENTION

It is an object of the present invention to provide a multichip package which comprises at least one first chip with high density and high frequency digital circuitry and at least one auxiliary second chip, wherein the first and the second chip are respectively disposed on the opposing upper and lower surfaces of the substrate, thereby decreasing the interconnection length between the chips and improving the electrical performance of the package.

It is another object of the present invention to provide a multichip package using flip-chip technology to eliminate package body thereof such that the first chip is exposed to the environment thereby increasing the thermal performance of the package.

It is still another object of the present invention to provide a multichip package with a heat spreader disposed in the upper surface of the substrate thereof and covering the area corresponding to the first chip thereby dissipating heat generated by the first chip efficiently and increasing the thermal performance of the package.

The multichip package in accordance with the present invention mainly comprises a substrate, a first chip disposed on the lower surface of the substrate, at least one second chip and a heat spreader disposed on the upper surface of the substrate, wherein the first chip is disposed on the substrate by flip-chip bonding and the heat spreader is attached to the substrate via a thermal conductive epoxy.

The present invention is characterized in that the heat spreader on the upper surface of the substrate covers the projective area corresponding to the first chip and preferably covers the entire projective area of the first chip thereby efficiently dissipating the heat generated by the first chip under normal operation. It is preferred that the heat spreader is made of good thermal-conductive metal like copper or aluminum. The heat spreader covers substantially the entire upper surface of the substrate except the area occupied by the second chip thereby efficiently using the spare space. Too much thickness of the heat spreader is not necessary, it is preferred that the top surface of the head spread is not higher than the top surface of the second chip, and it is more preferred that the top surface of the head spread and the top surface of the second chip are substantially coplanar.

Generally, the substrate is made of poor thermal conductive material; therefore, at least one thermal via which extends through the substrate is provided for conducting the heat generated by the first chip to the heat spreader, and at least one thermal trace which extends on the upper surface of the substrate is provided for conducting the heat generated by the second chip to the heat spreader.

Furthermore, the second chip can be disposed on the upper surface of the substrate by flip-chip bonding or conventional wire-bonding method and encapsulated by a package body.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
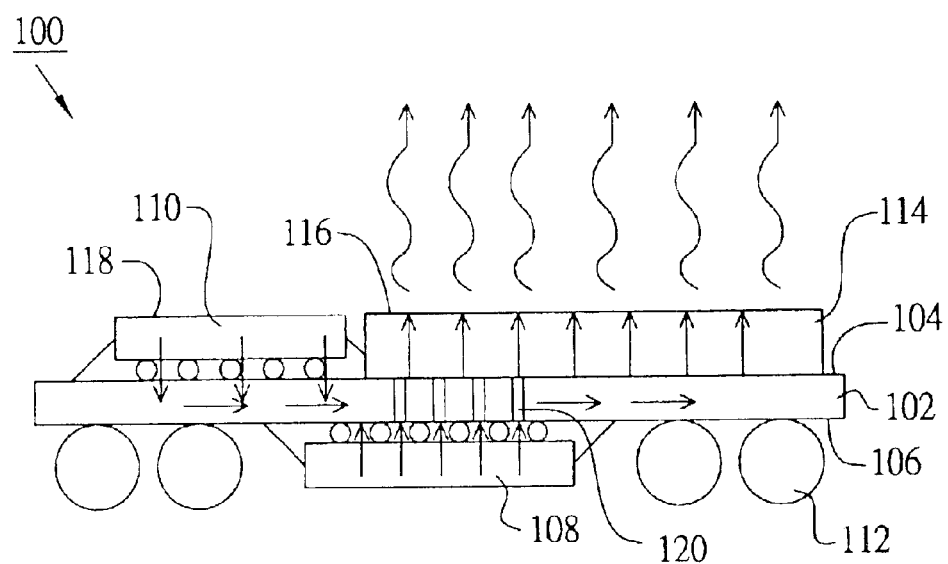
FIG. 1 is a cross sectional view of a multichip package according to a first preferred embodiment of the present invention.

FIG. 1 shows a multichip package 100 according to a first embodiment of the present invention. The multichip package 100 mainly comprises a substrate 102, a chip 108, a plurality of solder balls disposed on the lower surface of the substrate, at least one chip 110 and a heat spreader 114 disposed on the upper surface of the substrate, wherein the solder balls are respectively electrically connected to the chips 108 and 110.

The chip 108 is attached to the substrate 102 by flip-chip technology. So called "flip chip technology comprises several steps as below. At first, a plurality of solder bumps are formed on the chip and a plurality of bonding pads are formed on the corresponding positions on the substrate. Next, the chip is disposed onto the substrate in such a manner that the solder bumps on the chip are aligned with the bonding pads on the substrate. Then the solder bumps are reflowed by heating thereby the chip is secured on the substrate and electrically connected to the substrate. Finally, an underfill is filled between the chip and the substrate to protect the electrical interconnection between the chip and the substrate. Alternatively, a plurality of metal bump, e.g. gold bump or stud bump formed by a conventional wire bonding technique, can be formed on the chip first. Then the chip is secured on the substrate and electrically connected to the substrate by an anisotropic conductive adhesive film. One type of anisotropic adhesive suitable for forming the ACF is known as a "z-axis anisotropic adhesive". Z-axis anisotropic adhesives are filled with conductive particles to a low level such that the particles do not contact each other in the xy plane. Therefore, compression of the material in the z direction establishes an electrical path. One of the advantages to use flip-chip technique is that the underfill between the chip and the substrate can protect the electric interconnection between the chip and the substrate. Therefore, it's unnecessary to encapsulate the entire chip into a package body such that the back of the chip can be exposed to the environment. It results in a better thermal performance. Additionally, still another advantage to use flip-chip technique is that the thickness of the chip package can be decreased efficiently. Therefore, when the chip 108 is attached to the lower surface of the substrate 102 by flip-chip bonding, the thickness of chip 108 package can be designed to less than solder ball 112 (see FIG. 1) thereby assuring the package of a solder joint reliability.

However, the chip 110 is disposed on the upper surface of the substrate; therefore, the restriction on the thickness thereof is relatively less. By the way, the chip 110 doesn't have high density digital circuitry thereby generating relatively less heat. Therefore, the chip 110 can be electrically connected to the pre-provided bonding pads on the substrate by flip-chip bonding or other conventional technique like wire bonding or tape automated bonding. When the interconnection is conducted by wire bonding or tape automated bonding, the chip is preferably encapsulated in a package body (not shown) by transfer molding. It is understood that the package body can also be formed by glob-top process.

Figure 2:
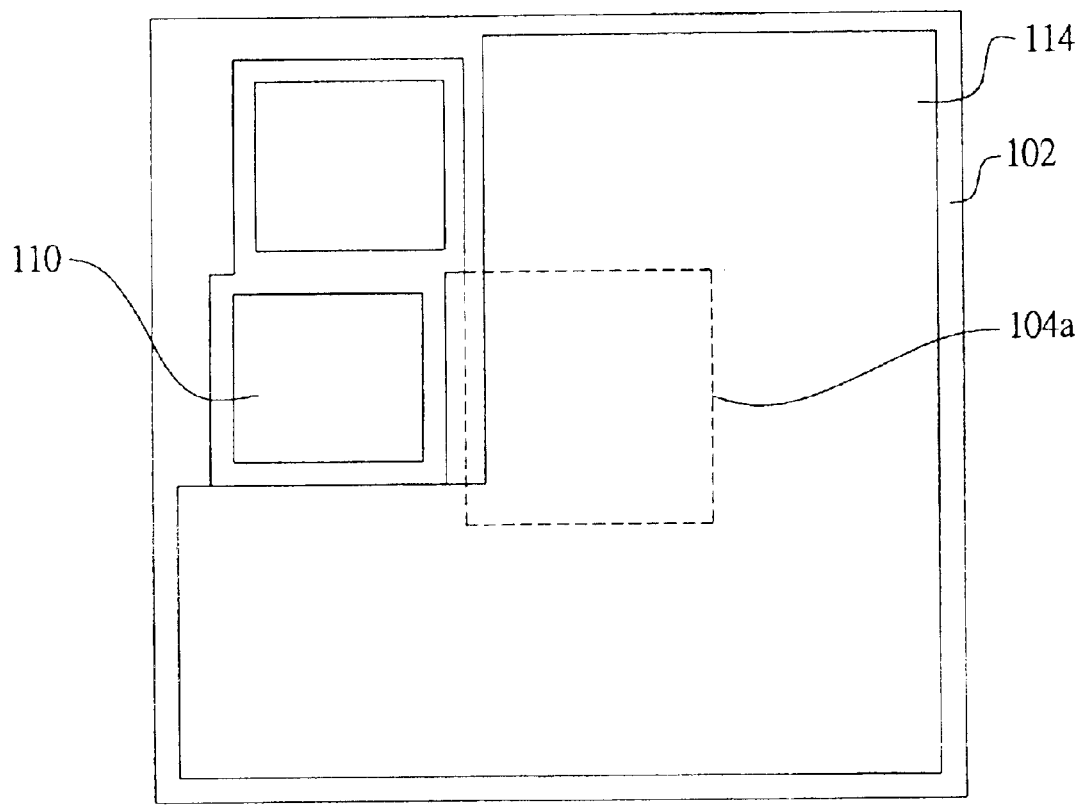
FIG. 2 is a top elevational view of the multichip package in FIG. 1.

As shown in FIG. 1, in the embodiment, the chips 110 and 108 are respectively disposed on the upper and lower surfaces 104 and 106 of the substrate 102. This structure is especially suitable for a multichip package which has high density and high frequency digital circuitry. Preferably, the chip with high density and high frequency digital circuitry (e.g. the chip 108 shown in FIG. 1) is disposed on the lower surface 106 of the substrate 102, and other chips which are cooperate with chip 108 are disposed side by side on the upper surface 104 of the substrate 102. Referring to FIG. 2, the chips 110 and 108 are respectively disposed on the upper and lower surfaces; therefore, the chip 110 can partially overlap the chip 108 thereby decreasing the interconnection length between the chip 108 and the chip 110 and gaining better electrical performance.

The main feature of the present invention is that not only a plurality of chips 110 but also a heat spreader 114 are provided on the upper surface 104 of the substrate 102. Generally, if a multichip package comprises a chip with high density and high frequency digital circuitry (e.g. the chip 108 shown in FIG. 1), the chip 108 not only generates more heat than other chip under operation but also needs more and more complicated corresponding exterior layout and bonding pads; therefore a bigger substrate is needed therein. As shown in FIG. 2, besides the chip 110, the upper surface 104 of the substrate still has a lot of spare space. In the embodiment, a heat spreader 114 is attached on the spare space of the upper surface 104 of the substrate 102 by a thermal conductive epoxy. Particularly, the heat spreader 114 covers the upper surface of the substrate at the projective area 104a which corresponds to the chip 108. More preferably, the heat spreader 114 covers most of the projective area 104a, even all of the projective area 104a such that the heat generated by the chip 108 can be dissipated by the heat spreader 114. Therefore, a better thermal performance can be achieved, and the spare space of the substrate can be efficiently utilized.

The heat spreader 114 can be made of good thermal conductive metal like copper or aluminum. Referring to FIG. 1, in the embodiment, when the heat spreader 114 is secured to the upper surface 104 of the substrate 102, the top surface of the heat spreader is not higher than the top surface of the chip 110 which is also secured on the upper surface 104 of the substrate 102 such that the entire thickness of the multichip package 100 won't be increased because of adding the heat spreader 114. More preferably, the top surface of the heat spreader and the top surface 118 of the chip 110 are coplanar thereby providing an even surface which can be provided with other more powerful heat spreader like finned heat sink, pinned heat sink, staggered pins heat sink or offset-strip heat sink or the like.

FIG. 1 & FIG. 2 are cross sectional view and top elevational view of the first embodiment of the present invention. In the first embodiment, the chip 110 is disposed at the rim of the substrate 102; therefore, the heat spreader just locates adjacent to the chip 110 but doesn't surround it. The present invention also provides a second embodiment of a multichip package 200, as shown in FIG. 3 & FIG. 4, the chip 110 thereof is disposed in the center of the substrate 102; therefore, the heat spreader can surround the chip 110 to achieve a better thermal performance.

Figure 3:
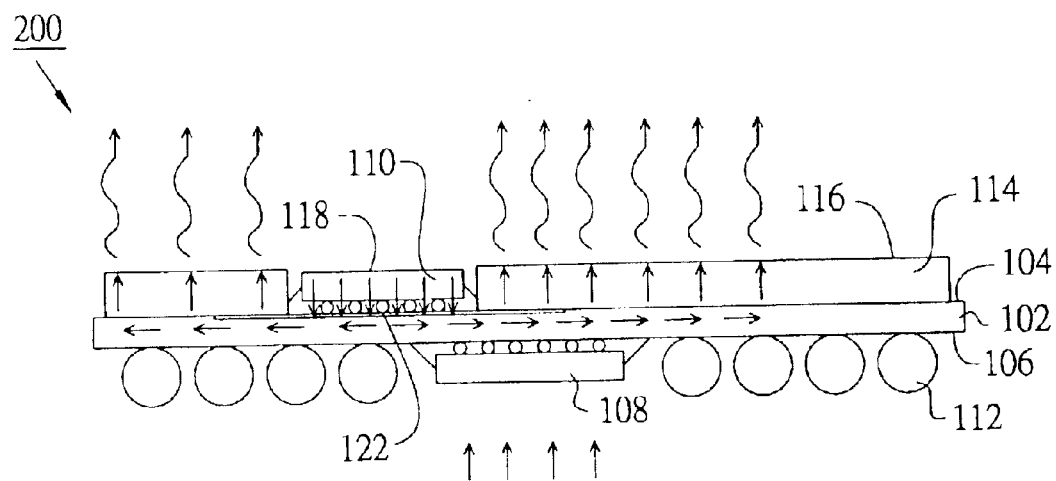
FIG. 3 is a cross sectional view of a multichip package according to a second preferred embodiment of the present invention.
Figure 4:
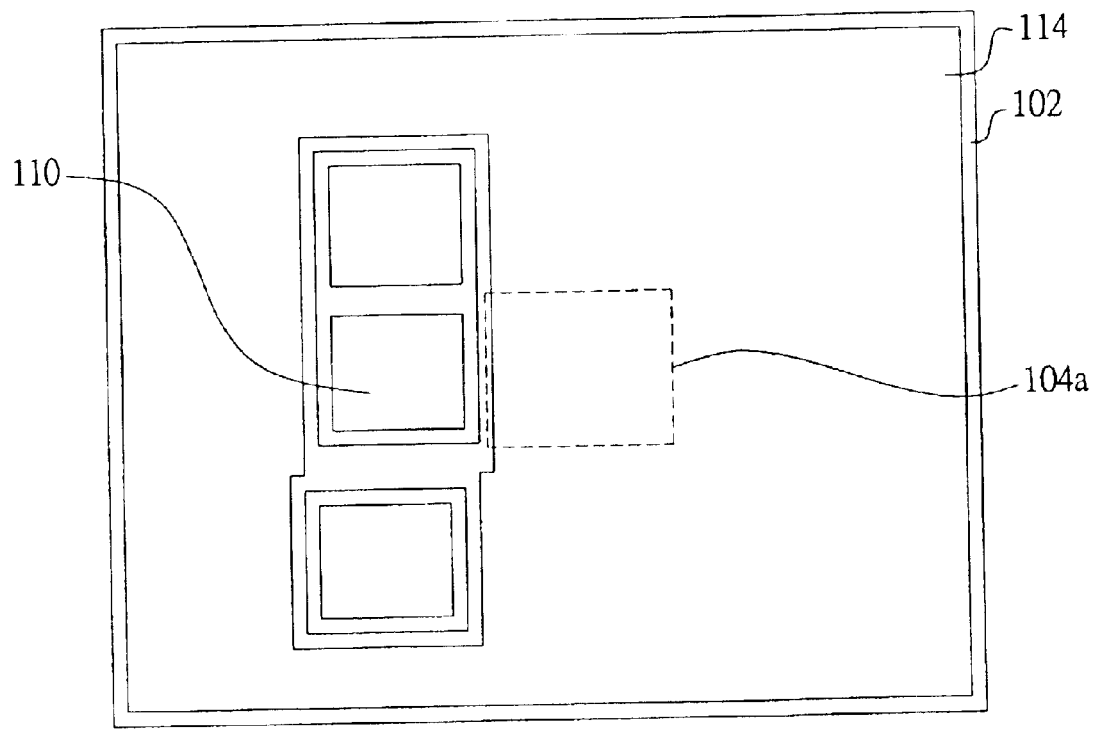
FIG. 4 is top elevational view of the multichip package in FIG. 2.

Referring to FIG. 1 & FIG. 3, the arrow marks denote the dissipating direction of the heat generated by the chips 108 and 110 under operation. Taking heat generated by chip 108 for example, the heat is transmitted through the substrate 102 to the heat spreader 114 then be dissipated to the environment. The larger area of the heat spreader 114 is, the more heat is efficiently dissipated. Therefore, it is preferred that the heat spreader covers substantially the entire upper surface of the substrate 102 except the location of the chip 110. Furthermore, the substrate 102 is generally made of bad thermal conductive material like FR-4 glass-epoxy or polyimide. Therefore, it is preferred that a plurality of thermal vias 120 (shown in FIG. 1) are formed on the substrate and extend through the substrate for conducting heat generated by chip 108 to the heat spreader 114; or a plurality of thermal traces 122 (shown in FIG. 3) are formed and extend on the upper surface 104 of the substrate 102 for conducting heat generated by the chip 110 to the heat spreader 114.

Figure 5:
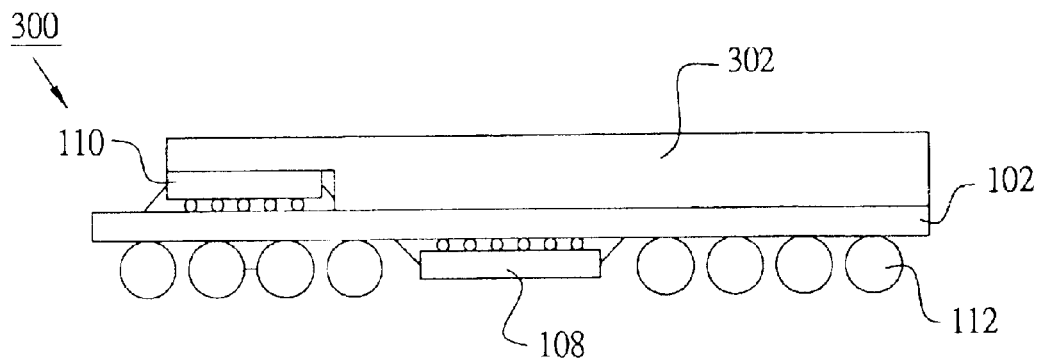
FIG. 5 is a cross sectional view of a multichip package according to a third preferred embodiment of the present invention.

FIG. 5 shows a multichip package 300 according to a third embodiment of the present invention. It is characterized by having an integral heat spreader 302. The heat spreader 302 is not only attached to the spare space without chip on the upper surface of the substrate but also attached on the chip 110 by an adhesive like conductive epoxy for helping dissipate heat generated by the chip 110 to the environment.

Figure 6:
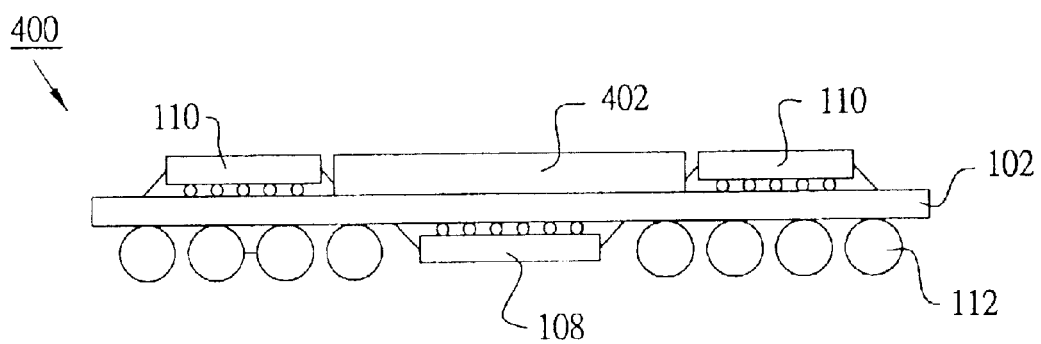
FIG. 6 is a cross sectional view of a multichip package according to a fourth preferred embodiment of the present invention.

FIG. 6 shows a multichip package 400 according to a forth embodiment of the present invention. The multichip package 400 is characterized by having the heat spreader disposed between the two chips 110.

Figure 7:
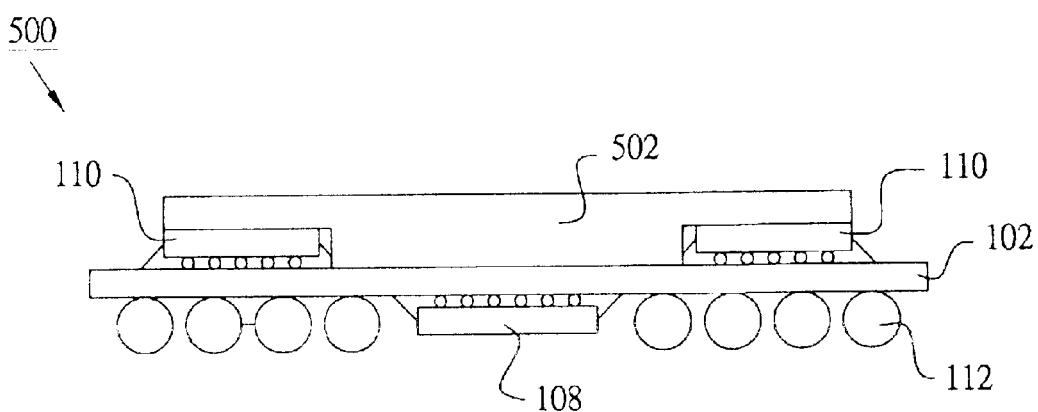
FIG. 7 is a cross sectional view of a multichip package according to a fifth preferred embodiment of the present invention.

FIG. 7 shows a multichip package 500 according to a forth embodiment of the present invention. The multichip package 500 is characterized by comprising an integral heat spreader 502 disposed between two chips 110 and attached to the two chips 110 by an adhesive like conductive epoxy for helping dissipate heat generated by the chip 110 to the environment.

The multichip package of the present invention has a plurality of chips respectively disposed on the upper and lower surfaces of the substrate thereof thereby shortening the electric interconnection between chips and increasing thermal performance thereof. Furthermore, each of the chips of the multichip package is mostly exposed to the environment in its back surface; therefore, heat generated under normal operation of each chip can be directly dissipated through the back of the chip. Additionally, a heat spreader is disposed at the spare space on the upper surface of the substrate thereby utilizing the space efficiently without increasing the thickness and the size of the package and dissipating the heat generated under normal operation of the chips efficiently for increasing the thermal performance of the multichip package and lowering the damages caused by over-heat to increase the stability and efficiency of the products.

Although the invention has been explained in relation to its preferred embodiment, it is to be understood that many other possible modifications and variations can be made without departing from the spirit and scope of the invention as hereinafter claimed. For example, although only two-layer structure is illustrated as preferred embodiments, the multi-chip modules with three-layer structure or above are still considered within the spirit and scope of the invention.

What is claimed is:

1. A multichip package comprising:
    a substrate having opposing upper and lower surfaces;
    a first chip disposed on the lower surface of the substrate by flip-chip bonding, wherein the upper surface of the substrate has a projective area corresponding to the first chip;
    at least one second chip disposed on the upper surface of the substrate;
    a plurality of solder balls formed at the periphery of the first chip on the lower surface of the substrate wherein some of the solder balls are electrically connected to the fist chip and the other solder balls are electrically connected to the second chip; and
    a heat spreader being disposed on the upper surface and covering the projective area.

2. The multichip package as claimed in claim 1, wherein the heat spreader is made of copper.

3. The multichip package as claimed in claim 1, wherein the heat spreader covers substantially the entire upper surface of the substrate except the location of the second chip.

4. The multichip package as claimed in claim 1, wherein the heat spreader and the second chip have top surfaces respectively, and the top surface of the heat spreader is not higher than the top surface of the second chip.

5. The multichip package as claimed in claim 4, wherein the top surface of the heat spreader and the top surface of the second chip are substantially coplanar.

6. The multichip package as claimed in claim 1, wherein the heat spreader is formed at the periphery of the second chip.

7. The multichip package as claimed in claim 1, wherein the heat spreader is attached to the substrate via a thermal conductive epoxy.

8. The multichip package as claimed in claim 1, further comprising at least one thermal via extending through the substrate for conducting heat generated by the first chip to the heat spreader.

9. The multichip package as claimed in claim 1, further comprising at least one thermal trace extending on the upper surface of the substrate for conducting heat generated by the second chip to the heat spreader.

10. The multichip package as claimed in claim 1, wherein the heat spreader covers the entire projective area of the first chip.

11. The multichip package as claimed in claim 1, wherein the first chip has high density, high frequency digital circuitry.

12. The multichip package as claimed in claim 1, wherein the second chip is disposed on the upper surface of the substrate by flip-chip bonding.

13. The multichip package as claimed in claim 1, wherein the second chip is disposed on the upper surface of the substrate by wire bonding.

14. The multichip package as claimed in claim 1, wherein the second chip is encapsulated in a package body.

15. The multichip package as claimed in claim 1, wherein the heat spreader has a portion disposed on the second chip.

16. A multichip package comprising:
    a substrate having opposing upper and lower surfaces;
    a first chip disposed on the lower surface of the substrate by flip-chip bonding;
    at least one second chip disposed on the upper surface of the substrate;
    a plurality of solder balls formed at the periphery of the first chip on the lower surface of the substrate wherein some of the solder balls are electrically connected to the fist chip and the other solder balls are electrically connected to the second chip; and
    a heat spreader disposed on the upper surface.

17. The multichip package as claimed in claim 16, wherein the heat spreader is made of copper.

18. The multichip package as claimed in claim 16, wherein the heat spreader covers substantially the entire upper surface of the substrate other then the location of the second chip.

19. The multichip package as claimed in claim 16, wherein the heat spreader and the second chip have top surfaces respectively, and the top surface of the heat spreader is not higher than the top surface of the second chip.

20. The multichip package as claimed in claim 19, wherein the top surface of the heat spreader and the top surface of the second chip are substantially coplanar.

21. The multichip package as claimed in claim 16, wherein the heat spreader is formed at the periphery of the second chip.

22. The multichip package as claimed in claim 16, wherein the heat spreader is attached to the substrate via a thermal conductive epoxy.

23. The multichip package as claimed in claim 16, further comprising at least one thermal via extending through the substrate for conducting heat generated by the first chip to the heat spreader.

24. The multichip package as claimed in claim 16, further comprising at least one thermal trace extending on the upper surface of the substrate for conducting heat generated by the second chip to the heat spreader.

25. The multichip package as claimed in claim 16, wherein the first chip has high density, high frequency digital circuitry.

26. The multichip package as claimed in claim 16, wherein the second chip is disposed on the upper surface of the substrate by flip-chip bonding.

27. The multichip package as claimed in claim 16, wherein the second chip is disposed on the upper surface of the substrate by wire bonding.

28. The multichip package as claimed in claim 16, wherein the second chip is encapsulated in a package body.

29. The multichip package as claimed in claim 16, wherein the heat spreader has a portion disposed on the second chip.

* * * * *